(12) United States Patent  (10) Patent No.: US 7,509,105 B2
Ziegler  (45) Date of Patent:  Mar. 24, 2009

(54) RADIO FREQUENCY EXCITATION ARRANGEMENT INCLUDING A LIMITING CIRCUIT

(75) Inventor: Joachim Ziegler, Schwanau (DE)

(73) Assignee: Huettinger Elektronik GmbH + Co. KG, Freiburg (DE)

( * ) Notice: Subject to any disclaimer, the term of this patent is extended or adjusted under 35 U.S.C. 154(b) by 649 days.

(21) Appl. No.: 11/330,897

(22) Filed: Jan. 11, 2006

(65) Prior Publication Data

US 2007/0037532 A1  Feb. 15, 2007

(51) Int. Cl.
*H04B 7/00* (2006.01)
(52) U.S. Cl. ..................... 455/222; 455/296
(58) Field of Classification Search .............. None
See application file for complete search history.

(56) References Cited

U.S. PATENT DOCUMENTS 4,673,886 A  6/1987  Bickley et al.
4,856,084 A * 8/1989  Richards, Jr. .............. 455/223
5,584,974 A  12/1996  Sellers
5,913,154 A  6/1999  Wynn
6,091,206 A * 7/2000  Siao ......................... 315/219

FOREIGN PATENT DOCUMENTS

DE         198 45 281     4/2000
EP         1 272 014      1/2003
WO         WO 02/099663   12/2002

* cited by examiner

*Primary Examiner*—Thanh C Le
(74) *Attorney, Agent, or Firm*—Fish & Richardson P.C.

(57) ABSTRACT

Disclosed is a method for limiting the voltage applied to a component in a radio frequency path (RF path) of a radio frequency excitation system. According to the method, a radio frequency signal (RF signal) is tapped at a first random point of the RF path, and energy is withdrawn from the RF path when the RF signal tapped at the first point or a value proportional to the tapped RF signal exceeds a reference value, resulting in the component being protected against excess voltages due to disturbances.

18 Claims, 2 Drawing Sheets

RADIO FREQUENCY EXCITATION ARRANGEMENT INCLUDING A LIMITING CIRCUIT

CROSS REFERENCE TO RELATED APPLICATIONS

This application claims priority under 35 U.S.C. §119(a) to PCT/EP 2004/008604, filed Jul. 30, 2004, which claims priority from DE 103 36 881.7, filed on Aug. 11, 2003, the entire contents of which are hereby incorporated by reference.

TECHNICAL FIELD

The application relates to a method for limiting the voltage, the current, or the power present at a component in a radio frequency path (RF path) of a radio frequency excitation arrangement caused by disturbances, and a radio frequency excitation arrangement for performing this method.

BACKGROUND

Radio-frequency excitation arrangements often consist of a radio frequency generator (RF generator) with an internal reactance network and a matching network to which a load can be connected. The load may be, e.g., the gas discharge in a plasma chamber. While plasma processes are performed in the plasma chamber for coating and processing materials, sparkovers, so-called arcs, occur again and again in the plasma chamber. These processes can cause the energy stored in blind elements of the matching network, the reactance network, or in other parts of the radio frequency excitation arrangement, to be rapidly discharged. The blind portions of the current, the voltage, and the power may amount to a multiple of the real portions and depend on the quality factor of the networks, and therefore far exceed the load limit of the overall system. The discharged energy, in particular the associated high voltages, can permanently damage or predamage the component assemblies and components, which will cause immediate or later failure of the RF generator or of the matching network.

MOSFETS are often used in transistorized RF amplifiers, which are part of the RF generator. MOSFETS are particularly sensitive to excess voltages. An excess voltage (voltage above the admissible voltage) from drain to source can cause a so-called avalanche effect that can destroy a MOSFET within a very short time. In the avalanche effect, electrons are accelerated by the high voltage such that they release further electrons from the lattice of the semi-conductor of which the MOSFETs are produced. The further electrons are also accelerated causing a chain reaction that can result in local breakdowns and degeneration of the lattice structures, generating so-called "hot spots". The MOSFET is destroyed within a relatively short time, ranging from a few µs to a few days, the time depending on the structure of the MOSFET, the voltage applied to the MOSFET, and the temperature at which the MOSFET is operating.

To avoid this problem, the power discharged to the load and the reflected power are measured in an RF system in different ways. Often, power control is used to keep the voltage at the sensitive components, i.e., in particular, at the MOSFETs within the permitted limits. This power control can be, however, much too slow for short-term pulses.

There have been attempts to keep disturbances by the load, i.e., in particular, a plasma source, away from the sensitive components using suitable filter arrangements. For example, U.S. Pat. No. 5,747,935 discloses a circuit for suppressing undesired disturbances from plasma sources using a filter that absorbs energy at all frequencies except for the basic frequency. Very fast pulses that occur during arcing in the plasma chamber, mainly those which have slew rates in the range of the slew rates of the basic frequency, are not absorbed thereby or are absorbed only to an insufficient extent. A switching device of this type can be realized for RF generators with a very small variation of the basic frequency. Moreover, a switching device of this type can represent an additional undesired energy storage.

The components of a radio-frequency excitation arrangement can be overdimensioned. For example, the MOSFETs that are used can bear an excess voltage of 600V even though only voltages of up to 300V are applied during normal operation. MOSFETs of this type are typically several times more expensive and can have a high forward resistance that can have a negative effect on the efficiency of the RF generator.

A so-called clipper circuit can be used to limit the voltage at sensitive components. Clipper circuits are, e.g., suppressor diodes, Zener diodes, or similar components or circuit arrangements consisting of several components. The reverse resistance of these clipper circuits changes at a defined voltage, the so-called breakdown voltage. When these components have adequate dimensions, they can protect sensitive components in the RF excitation arrangement. It may not be possible to exactly adjust these clipper circuits to the maximum admissible breakdown voltage at the component to be protected. If the voltage reaches a value close to the breakdown voltage, individual small breakdowns, noise, and harmonics can be generated. Such clipper circuits also have a capacitance that can generate a loss at the provided RF power. The RF excitation arrangement is changed by noise, harmonics, and capacitance mostly with a negative result. Such clipper circuits also can have a long uncontrollable recovery time that can result in instabilities in the RF generator.

SUMMARY

A method and a device effectively protects components that are sensitive to voltage, current, and power in a radio-frequency excitation arrangement. A radio frequency signal (RF signal) is tapped at a first random point of the RF path and energy is withdrawn from the RF path when the RF signal tapped at the first point or a value proportional to the tapped RF signal exceeds a reference value.

Energy is withdrawn from the RF path, thereby limiting or reducing the destructive energy potential in the RF path. An RF path is the path between an RF producer in an RF generator of a radio-frequency excitation arrangement and a load connection of the radio-frequency excitation arrangement. The protection method permits much faster reaction to temporary voltage, current, or power increases compared to prior methods. It is possible to precisely adjust the time and amount of energy withdrawn from the RF system using this reference value. The method decelerates the slew rate of fast excess voltages, currents or powers that occur, e.g., often during arcing in RF plasma systems, thereby also decelerating the voltage, current, or power increase at the component or component assembly to be protected in the RF path. When the reference value is small enough, longer dead times can be accepted or components having shorter avalanche time behavior can be used. The dead time is the time that passes between detection of an excess voltage and the start of energy withdrawal. The method can be realized in such a manner that almost no loss occurs during normal operation of the radio-frequency excitation arrangement and the properties of the RF path are not changed.

In one implementation, energy can be withdrawn by tapping an RF signal at a second point of the RF path, wherein the tapped RF signal at the second point is converted into a direct voltage signal, thereby limiting or decreasing it with the result that the RF path is not loaded during normal operation. Generation of a direct voltage signal corresponds to rectification of the RF signal. Disturbances with high frequency portions (that is, >about 100 kHz) can be attenuated more effectively by rectification, which provides additional protection for the components in the RF path. A voltage limiting circuit used for performing the method may react more slowly. The first and second points of the RF path at which an RF signal is tapped may be the same points. It is possible with the present method to protect components or component assemblies at any point in the RF path, and the first and second (tapping) points can be arbitrarily selected.

In another implementation, a rectified peak value or a value proportional thereto is generated from the RF signal tapped at the first point. Through peak value rectification, a value can be produced that is proportional to the measured peak value of the RF signal. Peak value rectification permits comparison with a reference value.

The peak value or the proportional value is compared with the reference value. The value obtained from the peak value rectification can be simply compared with a direct voltage reference signal, permitting exact adjustment of the method. The reference value, for example, a reference voltage may be selected to be relatively smaller for very fast changes in RF signals in the RF path than would be absolutely necessary for the component to be protected to compensate for the dead time or be able to operate with longer dead times.

The RF signal can be tapped at the first point in the direct vicinity of a component to be protected from a voltage, since such a configuration permits better measurement of the RF signal. Additionally, such a configuration improves protection of the component without loading the RF excitation arrangement at this point or changing its properties.

Changes in the RF signal can be detected at the first point with a reaction speed ≦about 100 μs, preferably ≦about 10 μs, with particular preference ≦about 1 μs, thereby keeping the dead time short, i.e., the time that passes between detection of an excess voltage and a reaction thereto, in particular, withdrawal of energy. The dead time is shorter than the time within which the component to be protected would be destroyed.

A radio-frequency excitation arrangement has an RF path including an RF generator and extending from an RF generator to a load connection of the radio-frequency excitation arrangement. A voltage, current, or power limiting circuit is provided to protect the components of the RF path. The radio-frequency excitation arrangement includes a driving circuit connected to a first point of the RF path and generating an output signal from a comparison between an RF signal and a reference value, and an energy converter that is also connected to the RF path. The driving circuit drives the energy converter with the output signal, the energy converter withdrawing energy from the radio-frequency excitation arrangement when the reference value is exceeded. Withdrawal of energy has the effect that the voltage and/or the current in the RF path rise more slowly and reach a lower maximum value, which protects the components in the RF path. The RF path may thereby include reactance, impedance, and matching networks. The RF path contains, in particular, all components between an RF producer of the RF generator and the load connection of the radio-frequency excitation arrangement.

Driving circuits of the most different kinds can be used. In one implementation, the driving circuit may be a Zener diode that is connected to the RF path and the energy converter. The Zener diode has a high resistance up to a certain voltage, the reference voltage. When the reference voltage is exceeded, its resistance becomes low, which changes the behavior of the energy converter with the result that the energy converter withdraws energy, in particular, in the form of heat, from the RF path, thereby reducing the voltage in the RF path and protecting the components.

The energy converter may include a rectifying circuit that generates a direct voltage from the RF signal. A rectifying circuit of this type does not load the RF path during normal operation but acts as load in case of temporary peak voltage increases in the RF path and decelerates the voltage increase.

The rectifying circuit may include a diode and a capacitor that is connected to ground. The rectifying circuit is hence realized in a simple manner using few components.

The energy converter may include an adjustment member. The adjustment member permits optimum adjustment of the voltage limiting circuit to the requirements resulting from the RF path and the element to be protected. The energy withdrawal may, e.g., be adjusted to not only protect the component from an excess voltage but also to withdraw further energy to remove charge from the element to be protected. This may, e.g., be realized by continuing to withdraw energy after the peak value has dropped down to or below the reference value. The period of time during which energy is withdrawn may be predetermined. Alternatively, the voltage at the component may be reduced to a larger extent, withdrawing more energy than required to keep the voltage at the component below the limiting value of destruction of the component.

The adjustment member may be designed as adjustable resistance. An adjustable resistance permits adjustment of the amount of energy that is withdrawn in dependence on the tapped RF signal. The adjustable resistance may be designed as transistor, in particular as MOSFET, or consist of a combination of resistances and transistors. Electric energy is converted into heat in the resistance. This is one way to withdraw energy from the RF excitation arrangement. Alternatively, the electric energy could be returned into a current supply circuit.

The driving circuit may include a peak value detecting member whose output is connected to a comparator that drives the energy converter. The peak value detecting member can detect voltage peaks of the RF signals and prepare them for comparison with a reference value. A comparator can reduce the voltage in the RF path to a greater extent than required to protect the component. To this end, the output of the comparator can, in particular, be fed back to its input connected to the peak value detecting member. Such feedback may consist of a combination of resistances and capacitors. A PID controller can thereby be formed in a simple manner.

The peak value detecting member may include a voltage divider and a downstream peak value rectifier. The voltage divider has a high resistance and therefore virtually does not load the RF path. The voltage divider may be frequency-compensated to be able to detect voltages with high frequencies. It is moreover possible to detect voltages over a large frequency range. In case of overcompensation of the voltage divider, optimum reaction to fast changes in the disturbances is possible. The peak value rectifier generates an output signal that is proportional to the detected peak value and reacts quickly to changes in the RF signal. It quasi keeps the measured voltage at its maximum value. The resulting signal can be simply compared with a reference value.

If several driving circuits are provided, it is possible to precisely protect several individual components in the RF path. In particular, several peak value detecting members may be provided, wherein each peak value detecting member is connected to the RF path at each component to be protected, and all peak value detecting members are connected to the energy converter that consists, in particular, of a rectifier and an adjustable resistance.

The driving circuits may have allocated priorities. The driving circuit monitoring the most sensitive component may thereby have priority over the others. Alternatively, the first driving circuit that detects that a reference value has been exceeded, has the strongest influence on the comparator and hence on the energy converter. To this end, the peak value detecting members may be interconnected in a suitable manner via diodes.

If the rectifying circuit includes a voltage doubling circuit, the energy flux into the voltage limiting circuit can be reduced, thereby protecting the components of the rectifier and the adjustment member from overload.

The outputs of the peak value detecting member and/or the comparator may be connected to a control unit. The signals applied at the output of the peak value detecting member and at the output of the comparator may be processed by an external control unit to adjust the RF generator in case the disturbance is present longer than can be tolerated by the voltage limiting circuit. The voltage limiting circuit may alternatively be smaller in size, the faster the reaction of the control unit to disturbances or the signals at the outputs of the peak value detecting member and the comparator. Since the output signals are generated very fast, the time required to reduce the power of the RF excitation arrangement depends only on the speed of the control unit.

Further features and advantages can be extracted from the following description, from the figures, and from the claims. The individual features may be realized individually or collectively in arbitrary combination.

DESCRIPTION OF DRAWINGS

Like reference symbols in the various drawings may indicate like elements.

DETAILED DESCRIPTION

Figure 1:
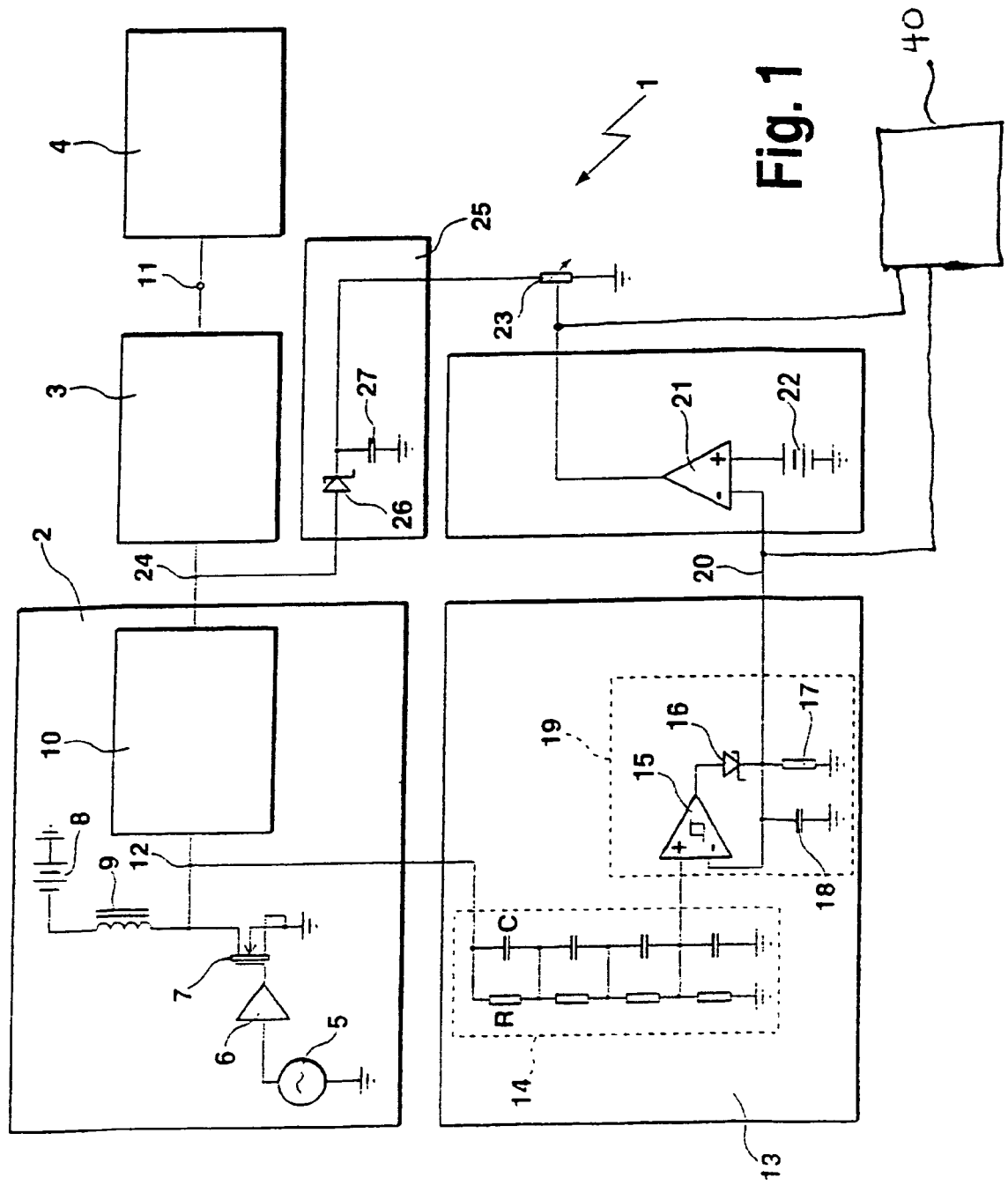
FIG. 1 shows a schematic view of a radio-frequency excitation arrangement.

Referring to FIG. 1, an RF system 1 includes an RF generator 2, a matching network 3, and a load 4 formed as plasma chamber. The RF generator 2 includes an RF producer 5 of low power, a driver 6, and a power transistor 7 such as a MOSFET, as shown in FIG. 1. The system 1 also includes a direct voltage source 8, a choke 9, and an internal reactance network 10. The arrangement consisting of RF producer 5, driver 6, power transistor 7, direct voltage source 8, choke 9, and internal reactance network 10 represents an RF amplifier, for example, a class E amplifier. The RF generator 2 generally has a fixed output resistance of usually about 50 ohms.

The load 4 is coupled to the matching network 3 through a load connection 11. The load 4 formed as plasma chamber has greatly varying input resistances depending on the gas pressure and state of the plasma. The matching network 3 dynamically adjusts the load resistance of the plasma to the output resistance of the RF generator 2. This adjustment is generally effected by changing the inductances and capacitances in the matching network 3, in most cases mechanically, e.g., by turning capacitor plates. For this reason, a reaction period to load changes in the ms range up to seconds is relatively slow. Faster load changes correspondingly cause reflections that, like arcs in the plasma chamber, can cause excess voltages in an RF path between the RF producer 5 and the load connection 11.

The RF system 1 also includes a peak value detecting member 13 that is connected at a first point 12 of the RF path. The peak value detecting member 13 taps an RF signal, in particular, a voltage or a current pulse at point 12 and supplies it to a voltage divider 14 that is connected to the first point 12, and, as shown to a drain connection of the power transistor 7. The voltage divider 14 has a high resistance in order not to influence the RF path at the first point 12, and consists of several resistances R that are connected in series with capacitors C that are each connected in parallel. The arrangement within the voltage divider 14 enables detection of alternating voltages of different frequencies with a large bandwidth. The capacitors C serve for compensating the input capacitance of a downstream comparator 15 of the peak value detecting member 13. The sensitivity over bandwidth can be adjusted through suitable selection of the values of the capacitors C. The peak value detecting member 13 includes a peak value rectifier 19 that includes the comparator 15, a diode 16, and the combination of a resistance 17 and a capacitor 18. The output signal of the peak value rectifier is a rectified peak value or a value proportional to the rectified peak value that is generated from the RF signal tapped at the first point 12. The output signal of the peak value rectifier 19 reacts very quickly, in particular, with reaction speeds<about 1 µs to changes in the RF signal at the first point 12. The envelope of the RF signal corresponds to the output signal of the peak value rectifier 19. Fast reaction at this point is beneficial since the sensitive components, such as, for example the power transistor 7, could be extremely quickly damaged by excess voltage.

An output 20 of the peak value detecting member 13 is switched to an input of a comparator 21. An adjustable reference voltage provided by an adjustable voltage source 22 is applied to the second input of the comparator 21. The output of the comparator 21 drives an adjustment member 23. The adjustment member 23 may be an adjustable resistance, such as, for example, a transistor. A combination of resistances and transistors is also advantageous in that it permits distribution of the power to several components.

The adjustment member 23 can have a high resistance at a first control voltage of the comparator 21 and a low resistance at a second control voltage. If the output signal of the peak value detecting member 13 is smaller than the reference voltage provided by the adjustable voltage source 22, then the first control voltage is applied at the output of the comparator 21. If the output signal of the peak value detecting member 13 exceeds the reference voltage provided by the adjustable voltage source 22, then the voltage at the output of the comparator 21 is changed from the first control voltage to the second control voltage with the consequence that the adjustment member 23 changes from high resistance to low resistance. Resistances and capacitances between the output of the comparator 21 and the signal input of the comparator 21 that is connected to the output 20 of the peak value detecting member 13 can be switched in such a manner that a so-called PID controller is formed.

A so-called dead time lapses between detection of the excess voltage at point 12 and reaction at the adjustment member 23. This dead time should be shorter than the time period in which the power transistor 7 would be destroyed by the excess voltage. To ensure this, the reference voltage at the comparator 21 may be selected to be smaller than the peak value measuring signal (that is, the output signal of the peak value detecting member 13), which corresponds to the maximum admissible voltage at the power transistor.

The RF system 1 also includes a rectifying circuit 25 that includes a diode 26 and a capacitor 27, and the circuit 25 is connected to the RF path at a second point 24. If the first control voltage is applied at the adjustment member 23, it has a high impedance to prevent discharge of the capacitor 27. The diode 26 is connected to the RF path at the second point 24. The capacitor 27 is charged to the rectified peak voltage of the second point 24. The capacitor 27 is thereby selected (first condition) to possibly prevent load of the RF path when the power is upwardly adjusted by the RF generator 2, i.e., the peak voltage slowly rises at the second point 24. The power is controlled with a time constant >about 1 ms. If the peak voltage drops at the second point 24, the voltage at the capacitor 27 is maintained. If the peak value detecting member 13 and the comparator 21 detect a peak voltage increase at the first point 12, the adjustment member 23 assumes a small resistance, thereby discharging the capacitor 27. The capacitor 27 is thereby dimensioned (second condition) in such a manner that, in case of temporary peak voltage increases in the range of a few µs or less at the second point 24, the rectifying circuit 25 acts as load and decelerates the voltage increase at the second and hence also at the first point 24, 12. The rectifying circuit 25 and the adjustment member 23 thereby represent an energy converter that withdraws energy from the radio-frequency excitation arrangement.

To determine the capacitance value C_load of the capacitor 27, the blind resistance Z of the capacitance is determined:
$Z=1/(j\omega C)=1/(j2\pi fC)$. This means that the capacitance must be sufficiently small to meet the first condition. The power is regulated with slew rates corresponding to a frequency of 200 Hz and less. When the upper limit for the capacitance C_load is set at $C\_load_{max}=1$ µF, then $Z_{min}$ at $f_{max}=200$ Hz is approximately 1 kΩ. When the second point 24 in the RF path is at a location where the impedance is at 10Ω, $Z_{min}$ would be larger by a factor of 100 and would load the RF power regulation only to a negligible extent. When the peak voltage at the second point 24 drops, the voltage at the capacitor 27 is maintained and no load is transported. Thus, the RF path is not loaded.

To meet the second condition, a minimum value for C_load must be determined. Components in the RF path react highly sensitively to disturbances with slew rates corresponding to a limit frequency of more than 100 kHz. One assumes, e.g., that the second point 24 in the RF path is at a point where the impedance is 10Ω. Moreover, it is expected that, e.g., at $f_{min}=100$ kHz, the impedance of the capacitor 27 has a maximum value $Z_{max}=50Ω$. This yields a minimum value of C_load of approximately 30 nF. This numerical example yields a value for C_load in the range between 30 nF and 1 µF.

The voltage limiting circuit includes the peak value detecting member 13, the comparator 21, the adjustment member 23, and the rectifying circuit 25. The voltage limiting circuit provides, due to its upstream tapping point at the second point 24 with downstream rectifying circuit 25, that the slew rate of fast voltage pulses (smaller than a few µs) that often occur during arcing in RF plasma systems, is decelerated at the first point 12 by withdrawing energy. The voltage increase at the power transistor 7 is consequently also decelerated, thus obtaining a smaller RF voltage amplitude.

The location of the tapping point of the second point 24 can be suitably selected within the RF path. The inner resistance is transformed within the internal reactance network 10 in a similar way as in the matching network 3. This yields different values for the inner resistance within the internal reactance network 10, and therefore for the peak voltages over the RF path. The second point 24 can be selected like in the above example at a point at which the inner resistance of the RF path is 10Ω but also at any other point. The maximum admissible peak voltage at the diode 26, the maximum admissible peak voltage through the diode 26, the maximum admissible voltage at the capacitor 27, and the adjustment member 23 can thereby be taken into consideration.

In one implementation, the RF system 1 is operated at a frequency of 13.56 MHz. Higher frequencies such as, e.g., 27 MHz are, however, also feasible. The power can be adjusted in a range between a few watts up to several kW. The voltage limiting circuit can also be used in RF systems 1 with much higher frequencies and much higher power.

In one implementation, one or more of the output 20 of the peak value detecting member 13 and the output of the comparator 21 can be connected to an external control unit 40. The signals applied at the output 20 of the peak value detecting member 13 and at the output of the comparator 21 may be processed by the control unit 40 to adjust the RF generator in case the disturbance is present longer than can be tolerated by the voltage limiting circuit. The voltage limiting circuit may alternatively be smaller in size, the faster the reaction of the control unit 40 to disturbances or the signals at the outputs of the peak value detecting member and the comparator. Since the output signals are generated very fast, the time required to reduce the power of the RF excitation arrangement depends only on the speed of the control unit 40.

Figure 2:
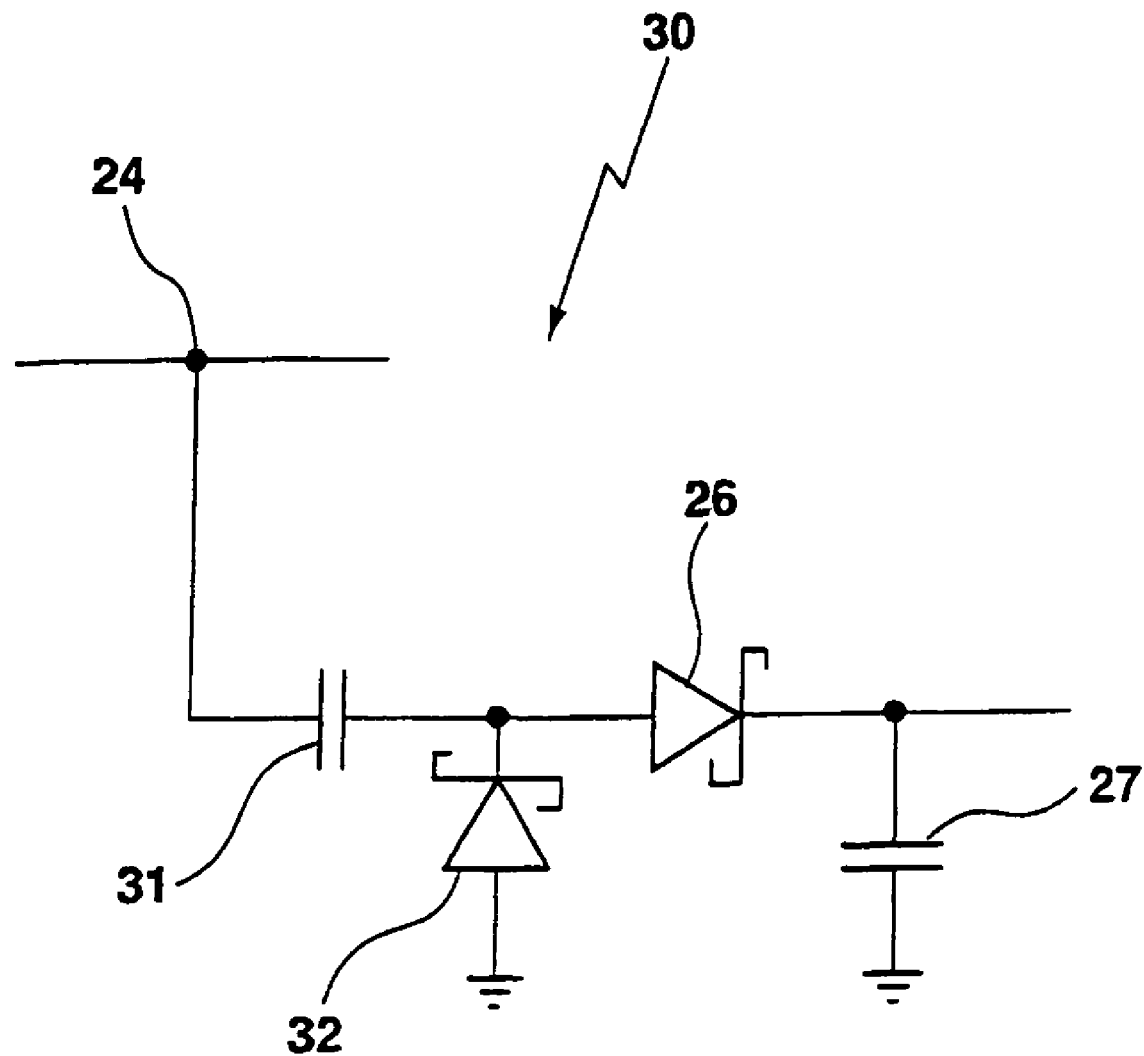
FIG. 2 shows a rectifying circuit for use in the arrangement of FIG. 1.

FIG. 2 shows another implementation of a rectifying circuit 30. The rectifying circuit 30 includes a capacitor 31 that is connected between the diode 26 and the second point 24, and a further diode 32 that is connected between the anode of the diode 26 and ground, wherein the anode thereof is connected to ground. A circuit arrangement of this type acts as voltage doubler. The capacitor 31 delimits the energy flux into the voltage limiting circuit and decouples the DC current. A circuit of this type provides protection of the diode 26 and the adjustment member 23 from excessive load due to excessive current.

Other implementations are within the scope of the following claims.

What is claimed is:

1. A method for limiting a voltage, a current, or a power present at a component in a radio frequency path (RF path) of a radio frequency excitation arrangement due to disturbances, the method comprising:
   tapping a radio frequency signal (RF signal) at a first arbitrary point of the RF path;
   generating a rectified peak value or a value proportional to the rectified peak value from the RF signal tapped at the first point; and
   withdrawing energy from the RF path when the generated rectified peak value or the generated proportional value exceeds a reference value.

2. The method of claim 1, wherein the component includes a power transistor.

3. The method of claim 1, further comprising comparing the RF signal to the reference value.

4. The method of claim 1, wherein withdrawing energy includes tapping an RF signal at a second point of the RF path, wherein the tapped signal at the second point is converted into a direct voltage signal that is limited or reduced.

5. The method of claim 1, wherein the RF signal is tapped at the first point in a direct vicinity of the component to be protected from a voltage.

6. The method of claim 1, wherein changes in the RF signal are detected at the first point with a reaction speed $\leq 100$ µs.

7. The method of claim 1, wherein changes in the RF signal are detected at the first point with a reaction speed $\leqq 10$ μs.

8. The method of claim 1, wherein changes in the RF signal are detected at the first point with a reaction speed $\leqq 1$ μs.

9. A radio frequency excitation arrangement including an RF path that includes an RF generator and a load connection of the radio-frequency excitation arrangement, the radio frequency excitation arrangement including a limiting circuit provided to protect components in the RF path, the limiting circuit comprising:
   a driving circuit connected to a first point of the RF path and generating an output signal from a comparison of an RF signal with a reference value, and
   an energy converter that is connected to the RF path,
   wherein the driving circuit drives the energy converter with the output signal, the energy converter withdraws energy from the radio-frequency excitation arrangement when the RF signal or a value proportional to the RF signal exceeds the reference value,
   wherein the driving circuit comprises a peak value detecting member whose output is connected to a comparator that drives the energy converter.

10. The radio frequency excitation arrangement of claim 9, wherein the energy converter comprises an adjustment member.

11. The radio frequency excitation arrangement of claim 10, wherein the adjustment member includes an adjustable resistance.

12. The radio frequency excitation arrangement of claim 9, wherein the energy converter comprises a rectifying circuit that generates a direct voltage from the RF signal.

13. The radio frequency excitation arrangement of claim 12, wherein the rectifying circuit comprises a diode and a capacitor connected to ground.

14. The radio frequency excitation arrangement of claim 12, wherein the energy converter comprises an adjustment member.

15. The radio frequency excitation arrangement of claim 14, wherein the adjustment member is designed as an adjustable resistance.

16. The radio frequency excitation arrangement of claim 9, wherein the peak value detecting member comprises a voltage divider and a downstream peak value rectifier.

17. The radio frequency excitation arrangement of claim 9, wherein an output of the peak value detecting member is connected to a control unit.

18. The radio frequency excitation arrangement of claim 9, wherein an output of the comparator is connected to a control unit.

* * * * *

UNITED STATES PATENT AND TRADEMARK OFFICE
CERTIFICATE OF CORRECTION

| | |
|---|---|
| PATENT NO. | : 7,509,105 B2 |
| APPLICATION NO. | : 11/330897 |
| DATED | : March 24, 2009 |
| INVENTOR(S) | : Joachim Ziegler |

It is certified that error appears in the above-identified patent and that said Letters Patent is hereby corrected as shown below:

On the Title page please insert the priority information: item (30);

-- Domestic Priority data as claimed by applicant
     This application is a CON of PCT/EP04/08604   07/30/2004

Foreign Applications
     Germany DE 103 36 881.7   08/11/2003 --

Signed and Sealed this

Second Day of June, 2009

JOHN DOLL
*Acting Director of the United States Patent and Trademark Office*